(12) United States Patent
Lee et al.

(10) Patent No.: US 10,845,928 B2
(45) Date of Patent: Nov. 24, 2020

(54) DISPLAY APPARATUS WITH TOUCH SENSOR

(71) Applicant: LG Display Co., Ltd., Seoul (KR)

(72) Inventors: Yangsik Lee, Gyeonggi-do (KR); HwiDeuk Lee, Gyeongsangbuk-do (KR); Jaeseung Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/507,622

(22) Filed: Jul. 10, 2019

(65) Prior Publication Data

US 2020/0026376 A1 Jan. 23, 2020

(30) Foreign Application Priority Data

Jul. 19, 2018 (KR) .......................... 10-2018-0084282

(51) Int. Cl.
*G06F 3/044* (2006.01)
*G06F 3/041* (2006.01)

(52) U.S. Cl.
CPC ............ *G06F 3/044* (2013.01); *G06F 3/0412* (2013.01); *G06F 3/0416* (2013.01); *G06F 2203/04102* (2013.01)

(58) Field of Classification Search
CPC ...... G06F 3/0416; G06F 3/044; G06F 3/0412; G06F 2203/04102; G06F 2203/04112; G06F 3/0446; G06F 3/0445; H01L 27/3276; H01L 27/323
See application file for complete search history.

(56) References Cited

U.S. PATENT DOCUMENTS

| 10,541,279 | B2* | 1/2020 | An ......................... G06F 3/0412 |
| 2016/0313843 | A1* | 10/2016 | Vanga ................... G06F 3/0416 |
| 2018/0107325 | A1 | 4/2018 | Hong et al. |
| 2018/0164933 | A1* | 6/2018 | Jun ...................... H01L 51/0023 |
| 2019/0302959 | A1* | 10/2019 | Clark ..................... G06F 3/0412 |
| 2019/0393274 | A1* | 12/2019 | Park ....................... G06F 1/1652 |

FOREIGN PATENT DOCUMENTS

| CN | 204166504 U | 2/2015 |
| CN | 106125993 A | 11/2016 |
| EP | 2843514 A | 3/2015 |
| JP | 2015090520 A | 5/2015 |

OTHER PUBLICATIONS

Combined Search and Examination Report issued in United Kingdom Patent Application No. 1910403.3 dated Dec. 19, 2019.

* cited by examiner

*Primary Examiner* — Muhammad N Edun

(74) *Attorney, Agent, or Firm* — Polsinelli PC

(57) ABSTRACT

A display device includes a display panel; a touch sensor sensing a capacitance of a plurality of nodes corresponding to a plurality of touch points on the display panel, wherein plurality of nodes includes a center node and a peripheral node surrounding the center node; a touch controller sensing a touch by detecting a capacitance change of the center node and the peripheral node, wherein the capacitance change of the center node is greater than the peripheral node; and a conductive layer disposed over the touch sensor that increases the capacitance change of the peripheral node.

19 Claims, 13 Drawing Sheets

*FIG.5B*

DISPLAY APPARATUS WITH TOUCH SENSOR

CROSS REFERENCE TO RELATED APPLICATION

This application claims priority from Korean Patent Application No. 10-2018-0084282, filed on Jul. 19, 2018, which is hereby incorporated by reference for all purposes as if fully set forth herein.

BACKGROUND OF THE DISCLOSURE

Field of the Disclosure

The present disclosure relates to a display apparatus, and more particularly to a display apparatus with a touch sensor. Although the present disclosure is suitable for a wide scope of applications, it is particularly suitable for providing a display device having a touch sensor that can accurately sense the touch.

Description of the Background

As the information society develops, the demand for display devices for displaying images is increasing in various forms. Various types of display devices such as a liquid crystal display device (LCD), a plasma display device, and an organic light emitting display device (OLED) have been used for this purpose.

The organic light emitting display device among these display devices has self-emission characteristics and has excellent response speed, viewing angle and color reproducibility, and can be manufactured to be thin.

The display device may operate in response to an input signal received through various input devices such as a keyboard and a mouse. The display device can input a user's command intuitively and conveniently by touching the screen using the touch panel. The touch panel may be disposed on the screen of the display device and allows the user to input a command of the user by touching a specific point on the screen of the display device. Such a touch panel may be embedded in the display device and integrated with the display device. The touch panel integrated in the display device may be referred to as a touch sensor.

The touch of the display device can be operated using a finger and/or a stylus pen. Generally, the touch area of the finger is large, but the touch area of the stylus pen is relatively small. In the case that the touch sensor senses the touch, the touch sensor may detect the change in the capacitance between the touched point and the surrounding point and may determine the touch position and/or the touch operation direction. However, if the touch area is relatively small as in the case of the stylus pen, there may be a problem that the recognition of the touch position and/or the touch operation direction may be inaccurately detected because of a small change in the capacitance of the peripheral points other than the touch point.

SUMMARY

Accordingly, the present disclosure is directed to a display apparatus having a touch sensor that substantially obviates one or more of problems due to limitations and disadvantages of the prior art.

Additional features and advantages of the disclosure will be set forth in the description which follows and in part will be apparent from the description, or may be learned by practice of the disclosure. Other advantages of the present disclosure will be realized and attained by the structure particularly pointed out in the written description and claims hereof as well as the appended drawings.

More specifically, the present disclosure is to provide a display device including a touch sensor that can accurately sense the touch.

In addition, the present disclosure is to provide a display device having a touch sensor capable of suppressing occurrence of defects and increasing production yield.

Further, the present disclosure is to provide a display apparatus having a touch sensor with a thin thickness.

To achieve these and other advantages and in accordance with the purpose of the present invention, as embodied and broadly described, there may be provided with a display device including: a display panel; a touch sensor disposed on the display panel; and a first conductive layer disposed on the touch sensor unit.

In accordance with another aspect of the present disclosure, there may be provided with a display device including a display panel; a touch sensor sensing a capacitance of a plurality of nodes corresponding to a plurality of touch points on the display panel, wherein plurality of nodes includes a center node and a peripheral node surrounding the center node; a touch controller sensing a touch by detecting a capacitance change of the center node and the peripheral node, wherein the capacitance change of the center node is greater than the peripheral node; and a conductive layer disposed over the touch sensor that increases the capacitance change of the peripheral node.

In accordance with a further aspect of the present disclosure there may be provided with a display device including a light emitting layer; an encapsulation layer sealing the light emitting layer, a touch electrode layer disposed on the encapsulation layer sensing a capacitance of a plurality of nodes corresponding to a plurality of touch points on the display panel, wherein plurality of nodes includes a center node and a peripheral node surrounding the center node; a passivation layer disposed on the touch electrode layer; a cover glass disposed on the passivation layer; a touch controller sensing a touch by detecting a capacitance change of the center node and the peripheral node, wherein the capacitance change of the center node is greater than the peripheral node; and a first conductive layer disposed between the passivation layer and the cover layer.

According to these aspects, it is possible to provide the display device having the touch sensor capable of accurately detecting the touch in the display panel by inducing a capacitance change of surrounding points.

According to the aspects, it is possible to provide the display device having the touch sensor capable of reducing the occurrence of defects.

According to the aspects, it is possible to provide the display device having the touch sensor with a small thickness.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain the principle of the disclosure.

In the drawings:

FIG. 5B is a diagram illustrating an example of a change in capacitance in the case that a touch is generated in the display device shown in FIG. 3B;

DETAILED DESCRIPTION

Figure 1:
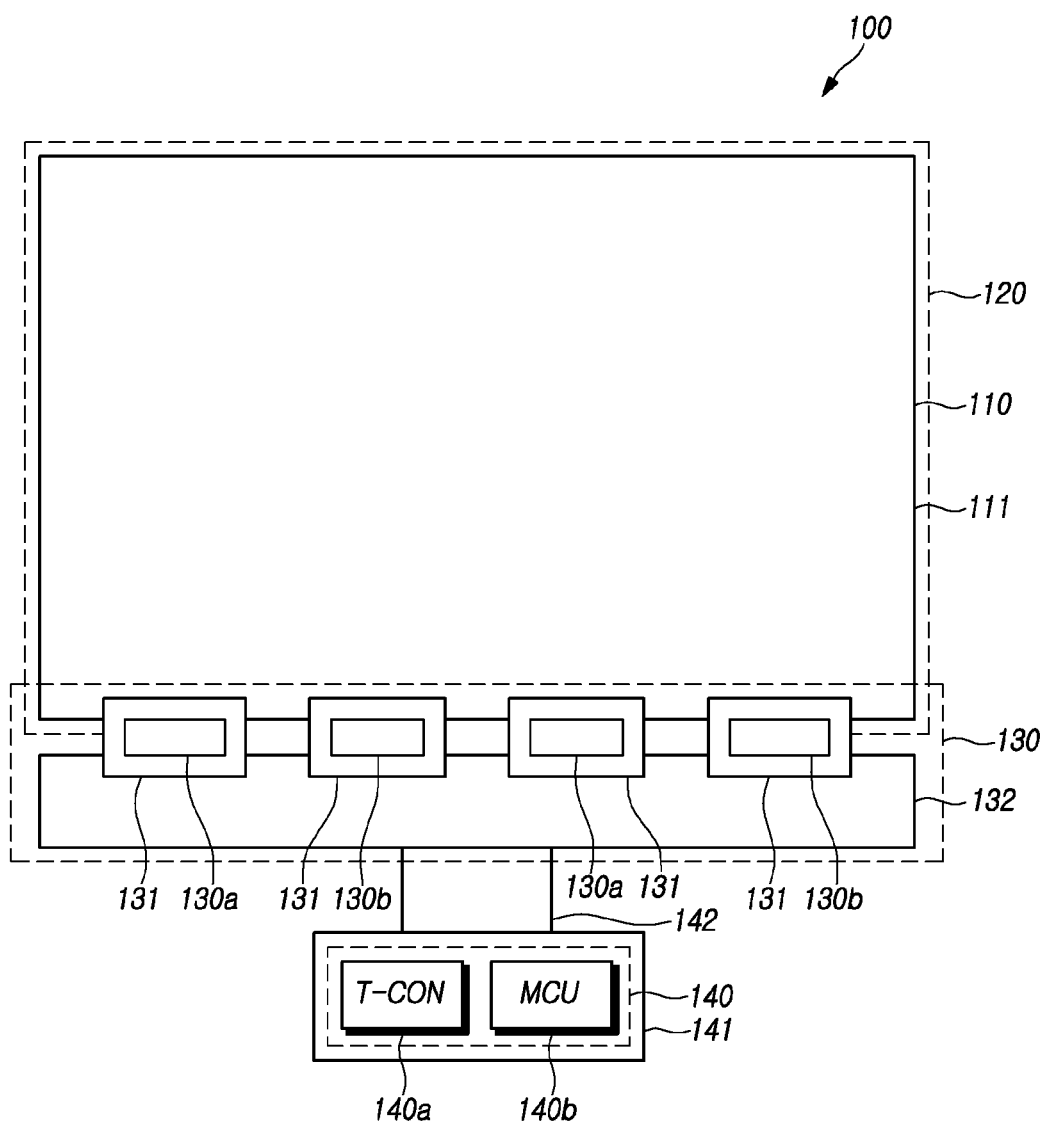
FIG. 1 is a structural diagram illustrating an aspect of the display apparatus having the touch sensor according to the present disclosure.

Hereinafter, some aspects of the present disclosure will be described in detail with reference to the accompanying illustrative drawings. In designating elements of the drawings by reference numerals, the same elements will be designated by the same reference numerals although they are shown in different drawings. Further, in the following description of the present disclosure, a detailed description of known functions and configurations incorporated herein will be omitted when it may make the subject matter of the present disclosure rather unclear.

In addition, terms, such as first, second, A, B, (a), (b) or the like may be used herein when describing components of the present disclosure. Each of these terminologies is not used to define an essence, order or sequence of a corresponding component but used merely to distinguish the corresponding component from other component(s). In the case that it is described that a certain structural element "is connected to", "is coupled to", or "is in contact with" another structural element, it should be interpreted that another structural element may "be connected to", "be coupled to", or "be in contact with" the structural elements as well as that the certain structural element is directly connected to or is in direct contact with another structural element.

FIG. 1 is a structural diagram illustrating an aspect of the display apparatus having the touch sensor according to the present disclosure.

Referring to FIG. 1, the display apparatus or the display device 100 may include a display panel 110, a touch sensor 120, a circuit unit 130, and a control unit 140. The display device 100 may be a liquid crystal display device or an organic light emitting display device, but is not limited thereto.

The display panel 110 may include a substrate 111. On the substrate 111, a plurality of gate lines (not shown) and a plurality of data lines (not shown) are disposed to be intersected with each other and a plurality of pixels may be arranged in an area where the plurality of gate lines and the plurality of data lines cross each other. In the case that the display device 100 is an organic light emitting display device, each pixel of the display panel 110 may include a light emitting element and a pixel circuit (not shown) for supplying driving current to the light emitting element. The light emitting element may be an organic light emitting diode (OLED). The organic light emitting diode may include an organic layer, an anode electrode and a cathode electrode through which current flows in the organic layer. The pixel circuit may be connected to lines for transferring a power source or a signal.

The pixel circuit may be connected to the gate line for transferring the gate signal and the data line for transferring the data signal. In addition, the pixel circuit may receive the data signal in response to the gate signal, and may generate the driving current and supply the generated driving current to the organic light emitting diode. In addition, the pixel circuit may be connected to a separate power line (not shown) to be supplied the driving current. However, the lines connected to the pixel circuit may be not limited to this case. The gate signal and the data signal may be referred to as a display driving signal. However, the display driving signal is not limited thereto.

The touch sensor 120 may sense a touch point of the display panel 110. The touch sensor 120 may include a plurality of touch electrodes disposed on the display panel 110. The plurality of touch electrodes may be connected to the touch lines, and the touch signals may be transmitted to the touch lines or received from the touch lines. The touch signal may include a touch driving signal and a touch sensing signal. Here, the touch sensor 120 is shown as one component on the display panel 110, but is not limited thereto.

The circuit unit 130 may transmit the display driving signal and the touch signal to the display panel 110 and the touch sensor 120, respectively. The circuit unit 130 may include a drive IC (Integrated Circuit) 130a for supplying the display driving signal and a touch IC 130b for transmitting and receiving the touch signal.

The drive IC 130a may include a gate driver for outputting the gate signal and a data driver for outputting the data signal. The drive IC 130a may receive the gate control signal and the data control signal and may operate the gate driver and the data driver. In the case that the display panel 110 is implemented in the form of the gate in panel (GIP), the gate driver may control the gate in panel (GIP) to receive the control signals from the gate driver and generate the gate signal and deliver the gate signal to the gate lines. The gate control signal may include a clock, a start pulse, a synchronization signal, but is not limited thereto.

The touch IC 130b may receive a touch control signal and may transmit and receive the touch signal to and from the touch sensing unit 120. The touch signal may include the touch driving signal and the touch sensing signal, but is not limited thereto.

Here, the number of the drive IC 130a and the number of the touch IC 130b may be two respectively, but is not limited thereto. The drive IC 130a and the touch IC 130b are shown alternately arranged, but are not limited thereto. The number of the drive IC 130a and the number of the touch IC 130b may be two respectively, but is not limited thereto. The number of the driver IC 130a and the number of the touch IC 130b are shown to be the same, but the present disclosure is not limited thereto. In addition, the circuit unit 130 may be implemented in such a manner that the drive IC 130a and the touch IC 130b are disposed on a flexible printed circuit board (FPCB) 131, respectively. The FPCB 131 may be connected to the substrate and the source printed circuit board (SPCB) 132 so that the driving control signal and the touch control signal transmitted through the SPCB 132 are respectively supplied to the drive IC 130a and the touch IC 130b. However, the arrangement of the circuit unit 130 is not limited to this, and the circuit unit 130 may be disposed in one area on the substrate 111. The substrate 110a may be flexible.

The control unit 140 may control the drive IC 130a and the touch IC 130b. The control unit 140 may output the driving control signal and the touch control signal. The control unit 140 may include the driving control unit 140a and the touch controller 140b. The driving control unit 140a may be a T-CON (timing controller), and the touch controller 140b may be an MCU (micro control unit).

The driving control unit 140a and the touch controller 140b may be disposed on a CPCB (Control Printed Circuit Board) 141 and the CPCB 141 may be connected to the circuit unit 130 through an FFC (flexible flat circuit) 142, but is not limited thereto.

Figure 2:
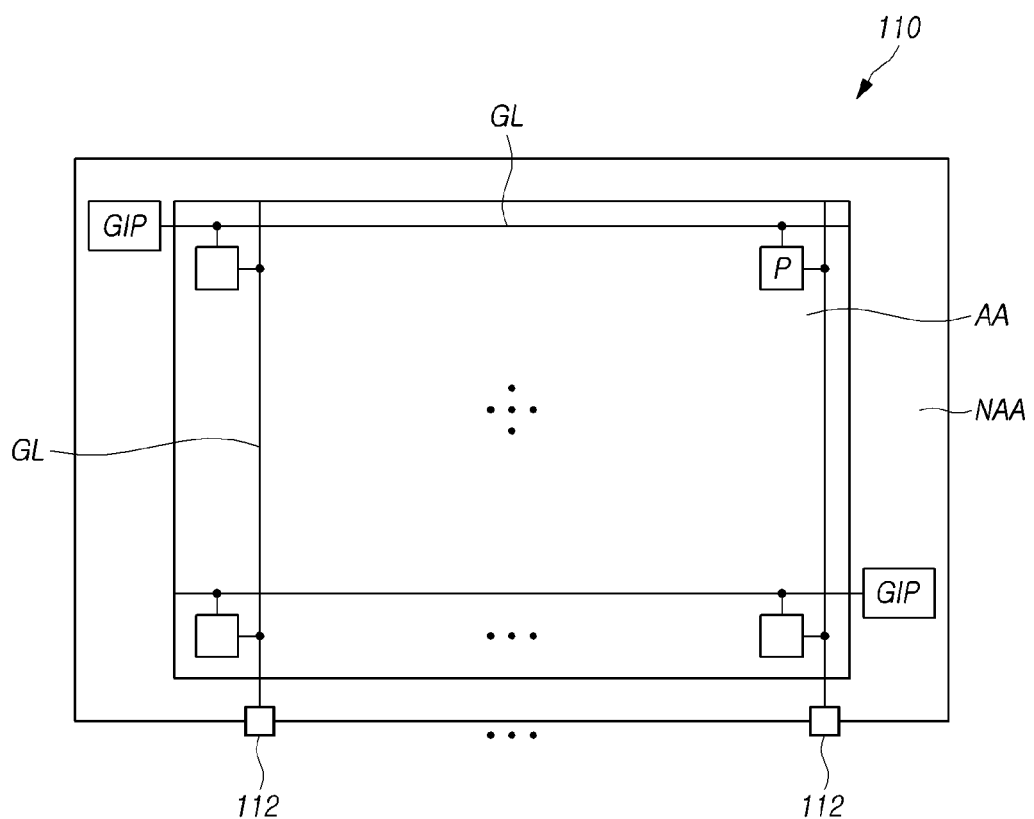
FIG. 2 is a plan view illustrating one aspect of the display panel shown in FIG. 1.

FIG. 2 is a plan view illustrating one aspect of the display panel shown in FIG. 1.

Referring to FIG. 2, the display panel 110 may include a substrate 111 on which the active area (AA) and the non-active area (NAA) may be disposed. A material of the substrate 111 may include plastic or glass. The active area (AA) may be disposed at the center of the substrate 111 and the non-active area (NAA) may be formed at the edge of the substrate 111, but is not limited thereto.

The plurality of pixels (P) may be arranged in the active area (AA) to display an image. The plurality of gate lines (GL) and the plurality of data lines (DL) may be disposed in the active area AA. A touch electrode (not shown) may be disposed on the active area (AA). The gate-in-panel (GIP) may be disposed in the non-active area (NAA) and the gate-in-panel (GIP) may transfer the gate signal to the pixels in response to the signal received from the circuit unit 130 shown in FIG. 1.

The pad 112 may be disposed below the non-active area (NAA) of the substrate 111 of the display panel 110. The pad 112 may be connected to the circuit unit 130 and may transmit and receive signals to and from the circuit unit 130 shown in FIG. 1. The area in which the pad 112 is disposed may be referred to as the pad area. The pad 112 may be connected to the data line (DL), but is not limited thereto. The pad 112 may be disposed to correspond to all the lines for transmitting and receiving signals to and from the circuit unit 130 shown in FIG. 1.

Figure 3A:
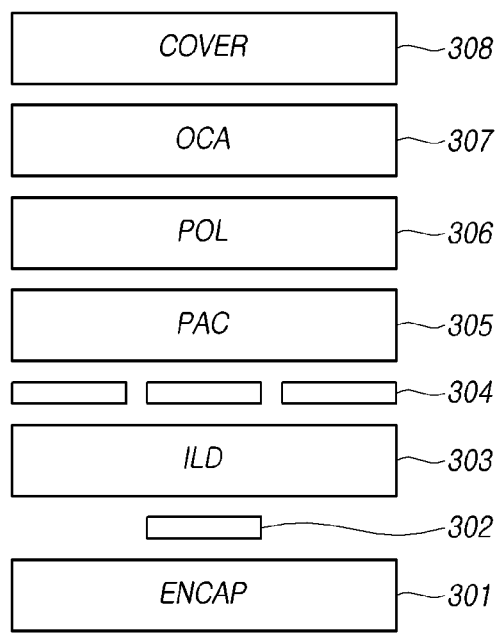
FIG. 3A is a structural diagram illustrating a first aspect of a display panel included in a display device according to the present disclosure.
Figure 3B:
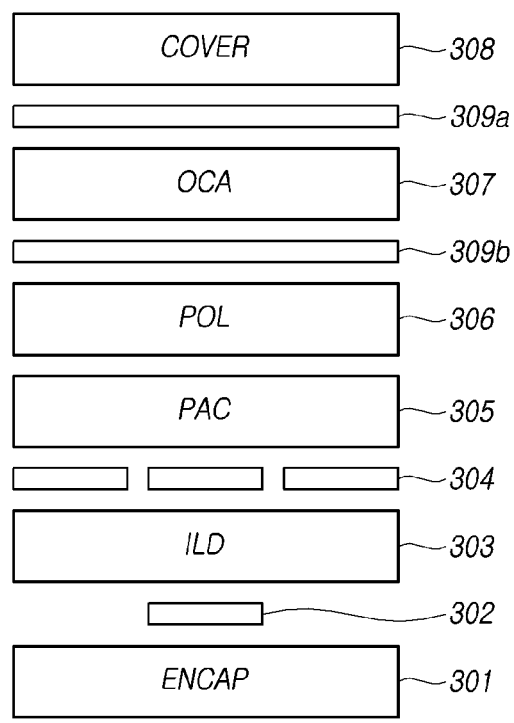
FIG. 3B is a structural diagram illustrating a second aspect of a display panel included in a display device according to the present disclosure.
Figure 3C:
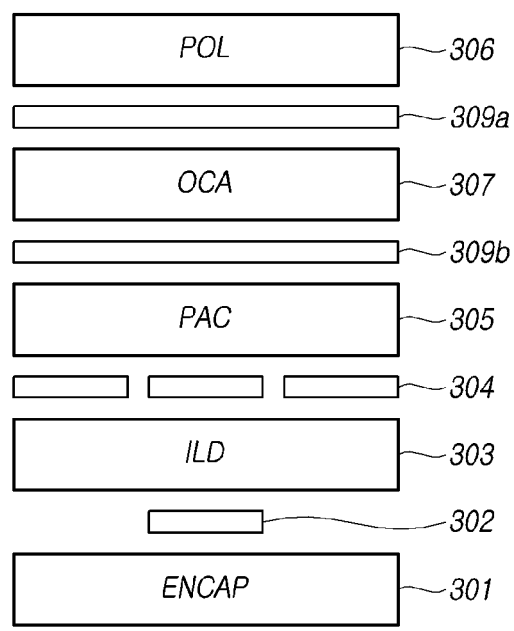
FIG. 3C is a structural diagram illustrating a third aspect of a display panel included in a display device according to the present disclosure.

FIG. 3A is a structural diagram illustrating a first aspect of a display panel included in a display device according to the present disclosure, FIG. 3B is a structural diagram illustrating a second aspect of a display panel included in a display device according to the present disclosure, and FIG. 3C is a structural diagram illustrating a third aspect of a display panel included in a display device according to the present disclosure.

Here, an aspect in which the display device 100 is an organic light emitting display device will be described as an example. The plurality of layers disposed on the encapsulation layer (ENCAP) of the display panel 110 shown in FIG. 2 will be described.

Referring back to FIG. 3A, the display device 100 may include the encapsulation layer 301, the bridge 302 disposed on the encapsulation layer 301, an insulation film 303 disposed on the bridge 302, a touch electrode layer 304 disposed on the insulation film 303, a passivation layer 305 disposed on the touch electrode layer 304, a polarization film 306 disposed on the passivation layer 305, an adhesive layer 307 disposed on the polarization film 306, and a cover glass 308 disposed on the adhesive layer 307. The insulation layer 303 may include a contact hole (not shown), and the bridge 302 and the touch electrode disposed on the touch electrode layer 304 may be connected through the contact hole. The touch electrode of the touch electrode layer 304 may include the touch driving electrode and the touch sensing electrode. The bridge 302 may connect the touch driving electrodes or the touch sensing electrodes to each other.

Referring to FIG. 3B, the display device 100 may include the encapsulation layer 301, the bridge 302 disposed on the encapsulation layer 301, an insulation film 303 disposed on the bridge 302, the touch electrode layer 304 disposed on the insulation film 303, the passivation layer 305 disposed on the touch electrode layer 304, the polarization film 306 disposed on the passivation layer 305, the adhesive layer 307 disposed on the polarization film 306, and the cover glass 308 disposed on the adhesive layer 307. The first conductive layer 309a may be disposed between the cover glass 308 and the adhesive layer 307. Further, the second conductive layer 309b may be disposed between the adhesive layer 307 and the polarization film 306. The first conductive layer 309a and the second conductive layer 309b are each illustrated to be a single film, but are not limited thereto, and may include a plurality of pieces. In this case, each of the plurality of pieces included in the first conductive layer 309a and the second conductive layer 309b may have a size corresponding to the area of one pixel. Alternatively, one piece may have a size corresponding to the sum of the areas of the plurality of pixels. The positions of the first conductive layer 309a and the second conductive layer 309b are not limited thereto and may be disposed on the touch electrode layer 304. Furthermore, only one of the first conductive layer 309a and the second conductive layer 309b may be provided. In addition, the plurality of pieces of the first conductive layer 309a and the second conductive layer 309b may be in the form of beads. In addition, the first conductive layer 309a and the second conductive layer 309b may be in a floating state with respect to each other.

Figure 4:
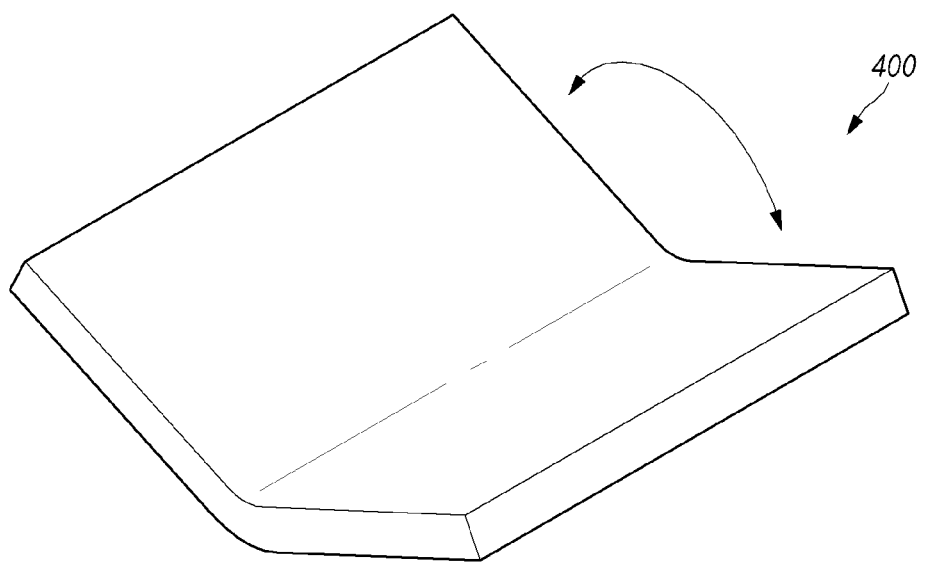
FIG. 4 is a diagram illustrating a state in which a flexible display device is folded.

Referring to FIG. 3C, The display device 100 includes the encapsulation layer 301, the bridge 302 disposed on the encapsulation layer 301, the insulation film 303 disposed on the bridge 302, the touch electrode layer 304 disposed on the insulation film 303, the passivation layer 305 disposed on the touch electrode layer 304, the adhesive layer 307 disposed on the passivation layer 305, and the polarization film 306 disposed on the adhesive layer 307. The first conductive layer 309a may be disposed between the polarization film 306 and the adhesive layer 307, and the second conductive layer 309b may be disposed between the adhesive layer 307 and the passivation layer 305. In this case, the display device 100 may include the cover glass different from that shown in FIG. 3B, so that the thickness of the display device 100 can be reduced. Furthermore, the display device 100 may have a property capable of folding. In the case that the display device 100 does not include the cover glass and the substrate of the display panel is a flexible substrate, the display device 400 may be folded as shown in FIG. 4.

Figure 5A:
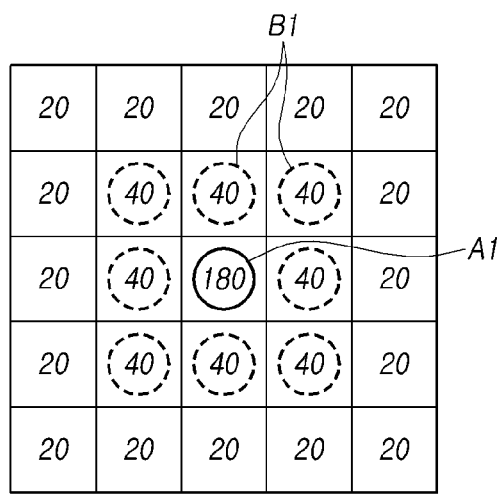
FIG. 5A is a diagram illustrating an example of a change in capacitance in the case that a touch is generated in the display device shown in FIG. 3A.
Figure 5B:
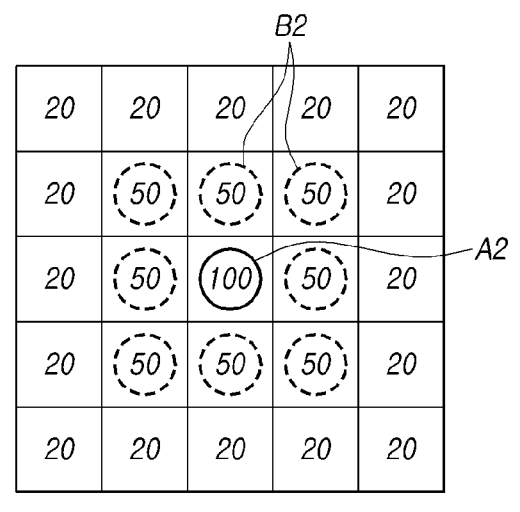

FIG. 5A is a diagram illustrating an example of a change in capacitance in the case that a touch is generated in the display device shown in FIG. 3A, and FIG. 5B is a diagram illustrating an example of a change in capacitance in the case that a touch is generated in the display device shown in FIG. 3B.

The upper surface of the display device may be divided into a plurality of nodes. Each node may represent a unit for determining the touch point. That is, if the touch occurs on the display device, the touch point may be referred to as the center node (A1, A2), and the periphery of the touch point may be referred to as peripheral nodes (B1, B2). Here, the center nodes (A1, A2) and the peripheral nodes (B1, B2) are shown as a circle. In the display device according to the present disclosure, when the touch occurs, the touch point may be determined by using one central node (A1 or A2) and eight peripheral nodes (B1, B2), but the number of nodes to determining the touch point is not limited thereto. The touch may be operated on the upper surface of the display device by using the stylus pen. In the case that the touch occurs by the stylus pen, the area of the tip touching the upper surface of the display device may be small, so that the touch area may be small and the touch of the stylus pen has little influence on the peripheral nodes. Therefore, the magnitude of the capacitance or capacitance change sensed in the central nodes (A1, A2) may be large, but the magnitude of the capacitance or capacitance change sensed at the peripheral nodes (B1, B2) may not be as large as the central nodes (A1, A2). In the display device according to the present disclosure, when the capacitance generated by the touch is detected, the center nodes having a relatively large capacitance change and the peripheral nodes having a relatively small capacitance change are determined, and the touch point is determined by using the determined center node and peripheral nodes or the capacitance change at each nodes.

Referring to FIG. 5A, in the case that a predetermined touch is generated on the display device, the capacitance generated at the center node (A1) may be 180 pF, for example, and the capacitance generated at the peripheral node (B1) may be 40 pF. However, referring to FIG. 5B, if a predetermined touch occurs in the display device, the capacitance generated at the center node (A2) may be 100 pF and the capacitance generated at the peripheral node (B2) may be 50 pF. That is, in the case of FIG. 5A, the capacitance difference between the center node (A1) and the peripheral node (B1) is 140 pF, but in the case of FIG. 5B, the capacitance difference between the center node (A2) and the peripheral node (B2) may be 50 pF.

The difference in capacitance in the case of FIG. 5B is smaller than that in the case of FIG. 5A because the first conductive layer 309a and/or the second conductive layer 309b are disposed between the touch electrode layer and the cover glass contacting the stylus pen. Here, the aspect in which only the first conductive layer 309a is disposed between the cover glass 308 and the touch electrode layer 304 will be described in order to simplify the explanation.

In the case that the first conductive layer 309a is disposed between the cover glass 308 and the touch electrode layer 304, a capacitor is formed between the first conductive layer 309a and the stylus pen, and thus the touch by the stylus pen generated at the center node (A2) may affect the peripheral node (B2) along the first conductive layer 309a. As a result, the capacitance of the center node (A2) may be lower than the capacitance at the center node (A1) shown in FIG. 5A, but the capacitance of the peripheral node (B2) may become larger than the capacitance of the peripheral node (B1) shown in FIG. 5A.

The touch controller 140b shown in FIG. 1 may determine the center node and the peripheral nodes on the display panel 110 in response to the capacitance change, and determine the touch point corresponding to a center node and the peripheral node. Therefore, as shown in the FIG. 5A, if the capacitance difference between the center node (A1) and the peripheral node (B1) is large and the magnitude of capacitance of the peripheral node (B1) is small, the peripheral node may not be recognized, thus the touch point may not be accurately calculated. However, as shown in FIG. 5B, the capacitance difference between the center node (A2) and the peripheral node (B2) is relatively small, therefore, the peripheral node (B2) may be relatively easily recognized, so that the accurate touch point may be calculated.

If the display device does not include the cover glass as shown in FIG. 3C, the thickness of the display device is reduced. When the thickness is reduced, the distance between the stylus pen and the touch electrode is also reduced. The strength of the electric field applied to the touch electrode by the stylus pen may increase with the distance between the stylus pen and the touch electrode. Therefore, in the case that the first conductive layer 309a and/or the second conductive layer 309b according to the present disclosure are not disposed, the capacitance at the center node may be large and the capacitance at the peripheral nodes may become small, and thus the touch point may not be accurately calculated similar to the case of FIG. 5A. Therefore, in this aspect, the first conductive layer 309a and/or the second conductive layer 309b are disposed, and the touch of the stylus pen may affect the capacitance of the peripheral node by the first conductive layer 309a and/or the second conductive layer 309b in order to calculate the touch point.

Here, the touch may include a case in which the stylus pen directly touches the display device, and a case in which the display device is indirectly touched through a hover within a certain distance.

In order for the touch of the stylus pen to affect the peripheral node without the first conductive layer 309a and the second conductive layer 309b, the touch electrode can be designed to have a specific pattern. In the case of the touch electrode pattern for influencing the peripheral nodes, the touch electrode pattern can have a compensating structure for transmitting the capacitance change generated at the center node to the peripheral node, and thus the touch electrode pattern may be complicated. As a result, the touch electrode pattern may be disconnected or short-circuited during the manufacture of the display device or during use of the display device, resulting in a problem that the production yield of the display device may be lowered or the possibility of failure increases. However, in the case that the touch of the stylus pen may affect the peripheral nodes by using the first conductive layer and/or the second conductive layer as described above, a general pattern of the touch electrode may be used to solve the above problem.

Figure 6:
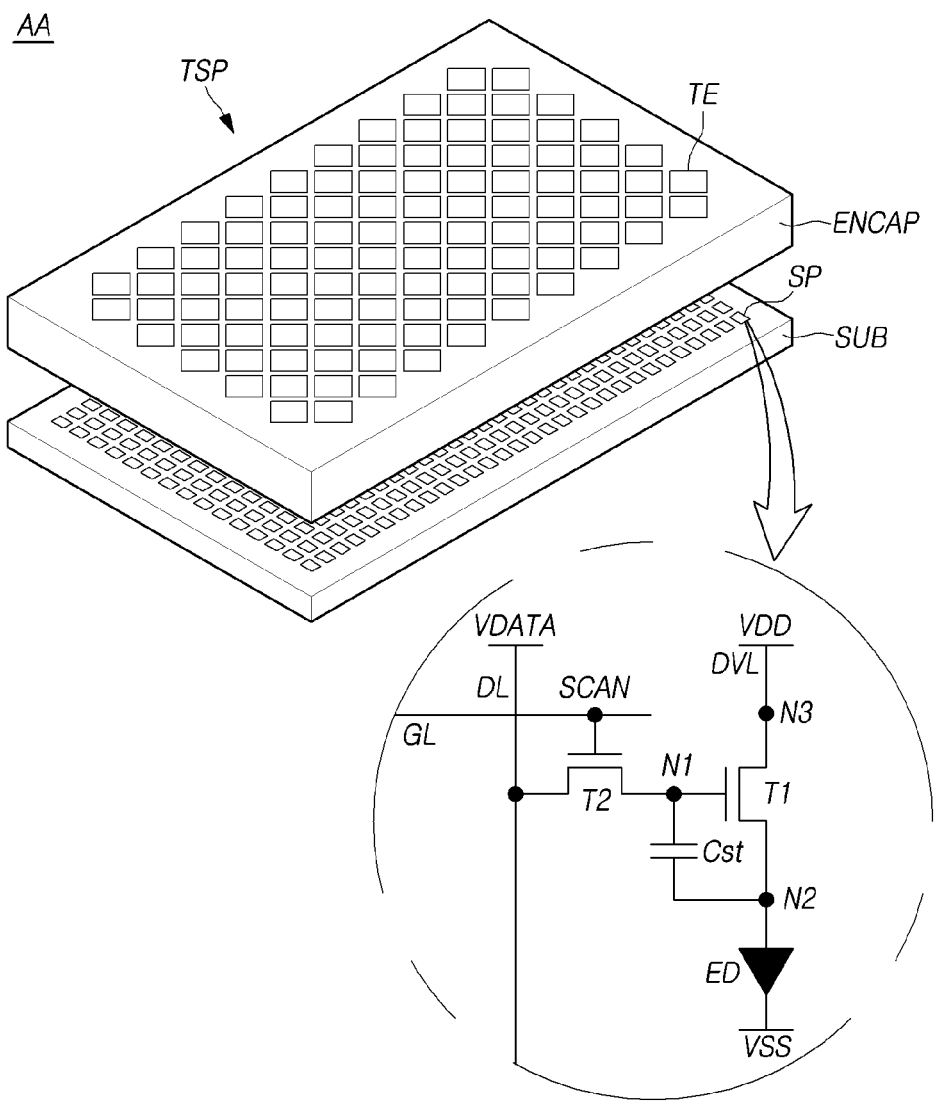
FIG. 6 is a perspective view illustrating an aspect of a structure in which the touch panel (TSP) is embedded in a display panel (DISP) according to the present disclosure.

FIG. 6 is a perspective view illustrating an aspect of a structure in which the touch panel (TSP) is embedded in a display panel (DISP) according to the present disclosure.

Referring to FIG. 6, in the active area (AA) of the display panel (DISP), the plurality of subpixels (SP) may be arranged on the substrate (SUB). Each subpixel (SP) may include the light emitting element (ED), the first transistor (T1) for driving the light emitting element (ED), the second transistor (T2) for transmitting the data voltage (VDATA) to the first node (N1) of the first transistor (T1), and the storage capacitor (Cst) for maintaining a constant voltage for one frame.

The first transistor (T1) may include the first node (N1) to which the data voltage is applied, a second node (N2) to be electrically connected to the light emitting element (ED), and a third node (N3) to which the driving voltage (VDD) from a driving voltage line (DVL) is applied. The first node (N1) may be a gate node, the second node (N2) may be a source node or a drain node, and the third node (N3) may be a drain node or a source node. The first transistor (T1) may be also referred to as a driving transistor for driving the light emitting element (ED).

The light emitting element (ED) may include a first electrode (eg, an anode electrode), a light emitting layer and a second electrode (eg, a cathode electrode). The first electrode may be electrically connected to the second node (N2) of the first transistor (T1) and a base voltage (VSS) may be applied to the second electrode. The light emitting layer in the light emitting element (ED) may include a plurality of layers. The light emitting layer may be an organic light emitting layer containing an organic material. In this case, the light emitting element (ED) may be an organic light emitting diode (OLED).

The second transistor (T2) may be turned on and off by a scan signal (SCAN) applied through the gate line (GL) and may be electrically connected between the first node (N1) of the first transistor (T1) and the data line (DL). The second transistor (T2) may be also referred to as a switching transistor. The second transistor T2 is turned on by the scan signal (SCAN) and transfers the data voltage (VDATA) supplied from the data line (DL) to the first node (N1) of the first transistor (T1).

The storage capacitor (Cst) may be electrically connected between the first node (N1) and the second node (N2) of the first transistor (T1).

Each subpixel (SP) may have a 2T1C structure including two transistors (T1, T2) and one capacitor (Cst) as shown in FIG. 6, and in some cases, may further include one or more transistors or one or more capacitors.

The storage capacitor (Cst) may not be a parasitic capacitor (eg, Cgs, Cgd) which is an internal capacitor existing between the first node (N1) and the second node (N2) of the first transistor (T1) but may be an external capacitor intentionally designed outside the first transistor (T1).

Each of the first transistor (T1) and the second transistor (T2) may be an n-type transistor or a p-type transistor.

As described above, the circuit elements such as the light emitting element (ED), two or more transistors (T1, T2) and one or more capacitors (Cst) may be arranged in the display panel (DISP). Such a circuit element (in particular, the light emitting element ED) may be vulnerable to external moisture or oxygen, and therefore, the encapsulation layer (ENCAP) for preventing external moisture or oxygen from introducing into the circuit element (in particular, the light emitting element ED) may be disposed on the display panel (DISP).

The encapsulation layer (ENCAP) may be a single layer or may be a plurality of layers.

For example, in the case that the encapsulation layer (ENCAP) comprises a plurality of layers, the encapsulation layer (ENCAP) may include one or more inorganic encapsulation layers and one or more organic encapsulation layers. As a specific example, the encapsulation layer (ENCAP) may comprise a first inorganic encapsulation layer, an organic encapsulation layer and a second inorganic encapsulation layer. Here, the organic encapsulation layer may be located between the first inorganic encapsulation layer and the second inorganic encapsulation layer.

The first inorganic encapsulation layer may be formed on the second electrode (eg, the cathode electrode) so as to be closest to the light emitting element (ED). The first inorganic encapsulation layer may be formed of an inorganic insulating material capable of low temperature deposition such as silicon nitride ($SiNx$), silicon oxide ($SiOx$), silicon oxynitride ($SiON$), or aluminum oxide ($Al_2O_3$). Accordingly, since the first inorganic encapsulation layer is deposited in a low-temperature atmosphere, damage to the light emitting layer (organic light emitting layer) vulnerable to a high-temperature can be prevented during the deposition of the first inorganic encapsulation layer.

The organic encapsulation layer may have a smaller area than the first inorganic encapsulation layer and may be formed to expose both ends of the first inorganic encapsulation layer. The organic encapsulation layer may function as a buffer for relieving the stress between the respective layers due to the bending of the touch display device, and can enhance the planarization performance. The organic encapsulation layer may be formed of, for example, an organic insulating material such as acrylic resin, epoxy resin, polyimide, polyethylene or silicon oxycarbide ($SiOC$).

The second inorganic encapsulation layer may be formed on the organic encapsulation layer so as to cover the upper surface and the side surfaces of the organic encapsulation layer and the first inorganic encapsulation layer, respectively. Accordingly, the second inorganic encapsulation layer can minimize or prevent external moisture or oxygen from penetrating into the first inorganic encapsulation layer and the organic encapsulation layer. The second inorganic encapsulation layer may be formed of, for example, an inorganic insulating material such as silicon nitride ($SiNx$), silicon oxide ($SiOx$), silicon oxynitride ($SiON$), or aluminum oxide ($Al_2O_3$).

In the touch display device according to the aspects of the present disclosure, the touch panel (TSP) may be formed on the encapsulation layer (ENCAP).

That is, in the touch display device, the touch sensor structure such as the plurality of touch electrodes (TE) forming the touch panel (TSP) may be disposed on the encapsulation layer (ENCAP).

In the touch sensing, the touch driving signal or the touch sensing signal may be applied to the touch electrode (TE). Therefore, in the touch sensing, a potential difference may be formed between the touch electrode (TE) and the cathode electrode disposed with the encapsulation layer (ENCAP) therebetween, and unnecessary parasitic capacitance may be generated. Since this parasitic capacitance may lower the touch sensitivity, the distance between the touch electrode (TE) and the cathode electrode may be set to a predetermined value (for example, 5 μm) or more. For this, for example, the thickness of the encapsulation layer (ENCAP) may be designed to be at least 5 μm or more.

Figure 7:
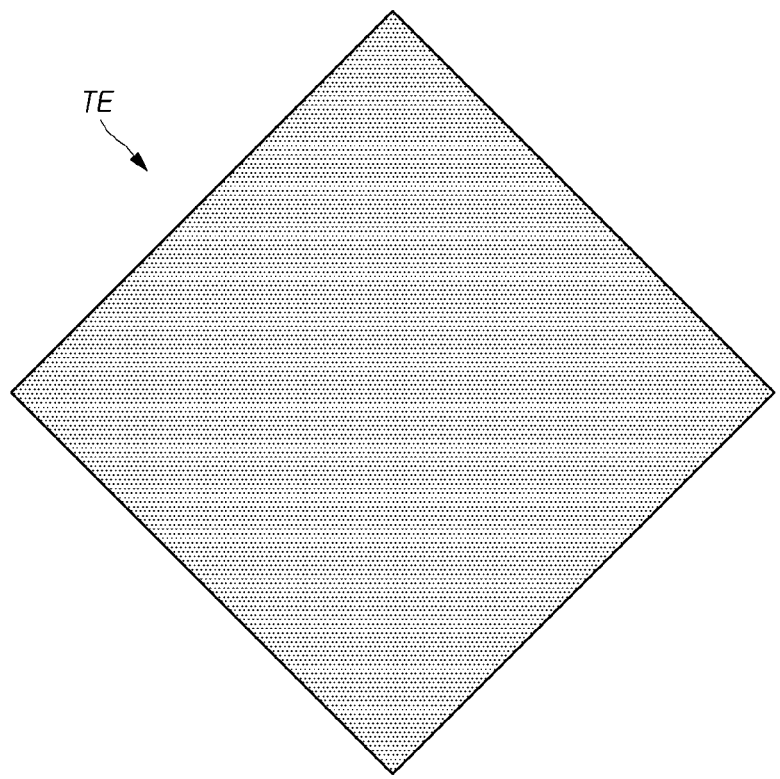
FIG. 7 is a plan view illustrating the first aspect of types of touch electrodes (TE) disposed on the display panel (DISP) according to the present disclosure.
Figure 8:
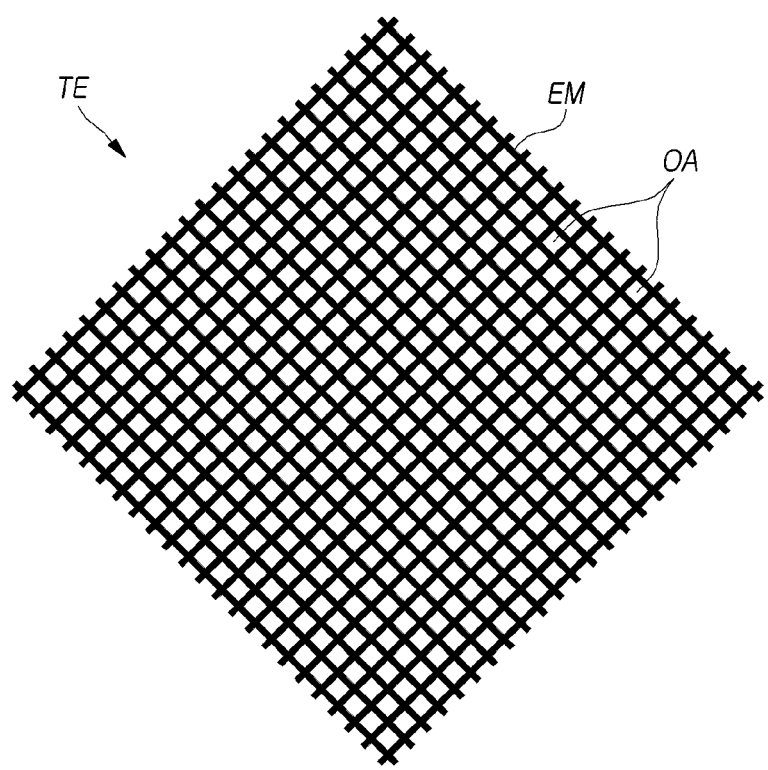
FIG. 8 is a plan view illustrating the second aspect of types of touch electrodes (TE) disposed on the display panel (DISP) according to the present disclosure.
Figure 9:
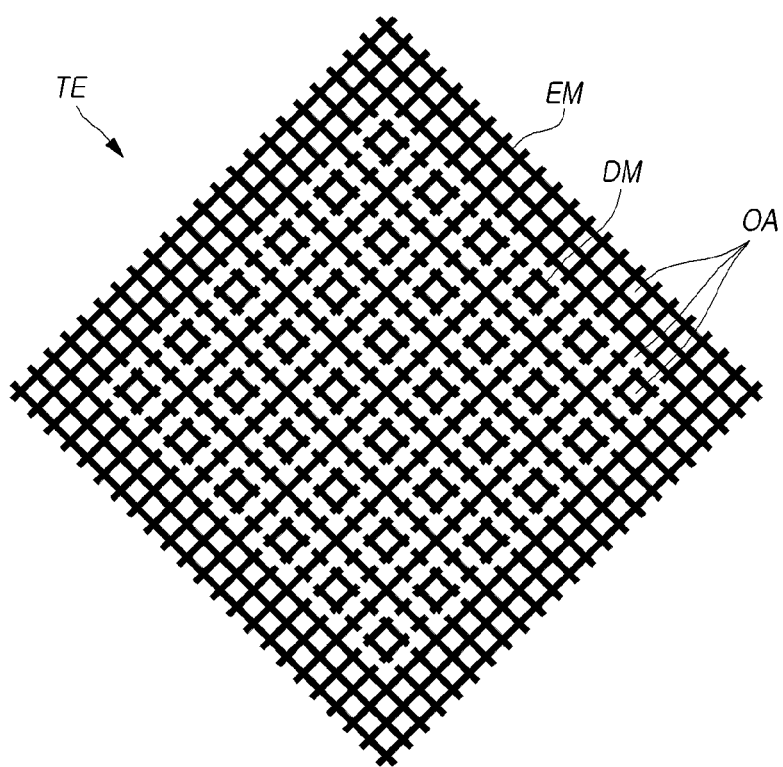
FIG. 9 is a plan view illustrating the third aspect of types of touch electrodes (TE) disposed on the display panel (DISP) according to the present disclosure.

FIG. 7 is a plan view illustrating the first aspect of types of touch electrodes (TE) disposed on the display panel (DISP) according to aspects of the present disclosure, and FIG. 8 is a plan view illustrating the second aspect of types of touch electrodes (TE) disposed on the display panel (DISP) according to aspects of the present disclosure, and FIG. 9 is a plan view illustrating the third aspect of types of touch electrodes (TE) disposed on the display panel (DISP) according to aspects of the present disclosure.

As illustrated in FIG. 7, each of the touch electrodes (TE) disposed on the display panel (DISP) may be a plate shaped electrode metal having no openings. In this case, each touch electrode (TE) may be a transparent electrode. That is, each touch electrode (TE) may be formed of the transparent electrode material so that light emitted from the plurality of subpixels (SP) arranged below may be transmitted upward.

Alternatively, as shown in FIG. 8, each of the touch electrodes (TE) disposed on the display panel (DISP) may be patterned into a mesh type to form electrode metal (EM) having two or more openings (OA).

The electrode metal (EM) corresponds to a substantial touch electrode (TE) and is a portion where the touch driving signal is applied or the touch sensing signal is detected.

As illustrated in FIG. 8, in the case that each touch electrode (TE) is the electrode metal (EM) patterned with a mesh type, two or more openings (OA) may exist in a region of the touch electrode (TE).

Each of the at least two openings (OA) in each touch electrode (TE) may correspond to a light emitting region of one or more subpixels (SP). That is, the plurality of openings (OA) may be paths through which the light emitted from the plurality of subpixels (SP) arranged below passes. Hereinafter, for convenience of explanation, it is assumed that each touch electrode (TE) is the mesh-type electrode metal (EM).

The electrode metal (EM) corresponding to each touch electrode (TE) may be located on a bank which is disposed in an area other than the light emitting area of two or more sub pixels (SP).

Meanwhile, as a method of forming the plurality of touch electrodes (TE), after the electrode metal (EM) is formed in a wide mesh shape, the electrode metal (EM) may be cut into a predetermined pattern to electrically separate the electrode metal (EM) to thereby form the plurality of touch electrodes (TE).

The outline shape of the touch electrode (TE) may be a square shape such as a diamond shape, a rhombus shape, or another shapes such as a triangle shape, a pentagon shape or a hexagon shape.

Referring to FIG. 9, in the area of each touch electrode (TE), there may be the mesh type electrode metal (EM) and at least one dummy metal (DM) separate from the mesh type electrode metal (EM).

The electrode metal (EM) is a portion corresponding to a substantial touch electrode (TE) and is the portion in which the touch driving signal is applied or the touch sensing signal is detected. Meanwhile, though the dummy metal (DM) may exist in the area of the touch electrode (TE), however the touch driving signal is not applied to the dummy metal (DM) and the touch sensing signal is not detected at the dummy metal (DM). That is, the dummy metal (DM) may be an electrically floated metal portion.

Accordingly, the electrode metal (EM) can be electrically connected to the touch driving circuit (TDC), but the dummy metal (DM) is not electrically connected to the touch driving circuit (TDC).

At least one dummy metal (DM) may exist in a state of being disconnected from the electrode metal (EM) in each region of each of the touch electrodes (TE).

Alternatively, at least one dummy metal (DM) may exist in the state of being disconnected from the electrode metal (EM) only in a region of each of some touch electrode among all the touch electrodes (TE). That is, the dummy metal (DM) may not exist in the area of some of the touch electrodes (TE).

As shown in FIG. 8, with regard to the role of dummy metal (DM), in the case that there is no dummy metal DM in the area of the touch electrode (TE) and only the electrode metal (EM) is formed as the mesh type, a visibility problem in which the contour of the electrode metal (EM) is visible on the display surface may occur.

In contrast, as shown in FIG. 9, in the case that one or more dummy metals (DM) are present in the area of the touch electrode (TE), the visibility problem of the outline of the electrode metal (EM) on the display surface may be prevented.

Furthermore, the capacitance of each touch electrode (TE) may be adjusted to improve the touch sensitivity by adjusting the presence or number (dummy metal ratio) of the dummy metal (DM) for each touch electrode (TE).

Meanwhile, the cut electrode metal (EM) may be formed of the dummy metal (DM) by cutting some points on the electrode metal (EM) formed in the area of one touch electrode (TE). That is, the electrode metal (EM) and the dummy metal (DM) may be the same material formed in the same layer.

The touch display device according to the aspects of the present disclosure may sense a touch based on the capacitance formed on the touch electrode (TE).

The touch display device according to aspects of the present disclosure may utilize the capacitance-based touch sensing method, which can sense a touch by a mutual-capacitance-based touch sensing method or a self-capacitance-based touch sensing method.

In the case of a mutual-capacitance-based touch sensing method, a plurality of touch electrodes (TE) may be classified into the driving touch electrode (transmission touch electrode) for applying the touch driving signal, and the sensing touch electrode (receiving touch electrode) which is used for detecting the touch sensing signal and forms capacitance with the driving touch electrode.

In the case of the mutual-capacitance-based touch sensing method, the touch sensing circuit (TSC) may detects presence/absence of touch and/or touch coordinates based on a change in capacitance (mutual-capacitance) between the driving touch electrode and the sensing touch electrode generated in accordance with the presence or absence of a pointer such as the finger, pen and the like.

In the case of a self-capacitance-based touch sensing method, each touch electrode (TE) may serve as both the driving touch electrode and the sensing touch electrode. That is, the touch sensing circuit (TSC) applies the touch driving signal to one or more touch electrodes (TE) and detects the touch sensing signal through the touch electrode (TE) to which the touch driving signal is applied. And then, the touch sensing circuit (TSC) may detect the presence or absence of a touch and/or the touch coordinates by using the change in capacitance between the touch electrode (TE) and the pointer such as the finger and the pen and based on the sensed touch sensing signal. In the self-capacitance-based touch sensing method, there is no distinction between the driving touch electrode and the sensing touch electrode.

As described above, the touch display device according to the aspects of the present disclosure can sense the touch by the mutual-capacitance-based touch sensing method or the self-capacitance based touch sensing method. Hereinafter, for convenience of explanation, there is described as an example, the touch display device performing the mutual-capacitance-based touch sensing and having the touch sensor structure for this purpose.

Figure 10:
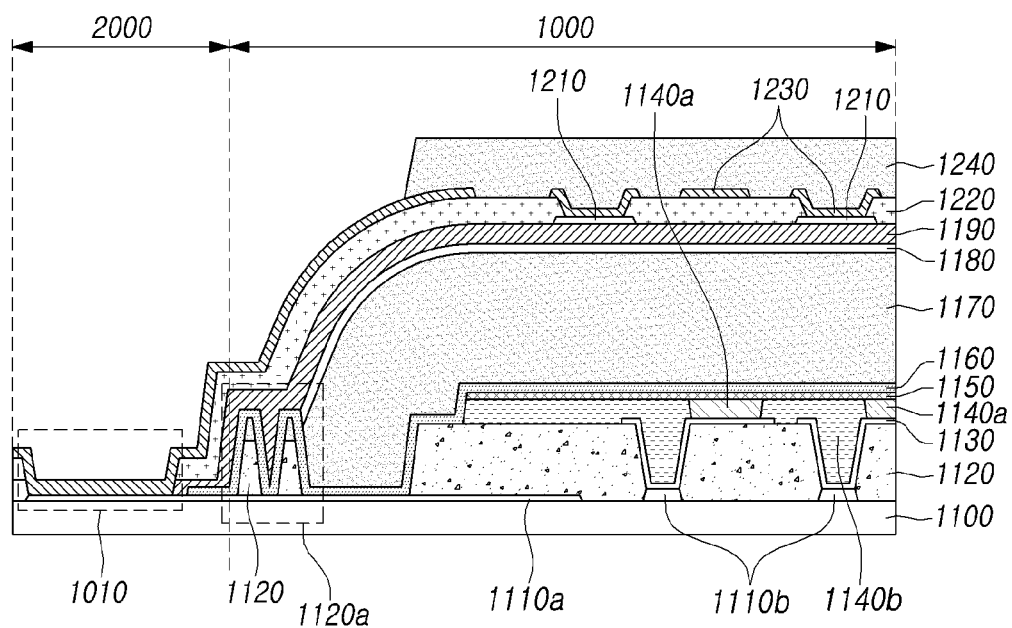
FIG. 10 is a cross-sectional view illustrating an aspect of a cross section of the display device according to the present disclosure.

FIG. 10 is a cross-sectional view illustrating an aspect of a cross section of the display device according to aspects of the present disclosure.

Referring to FIG. 10, the substrate 1100 may be divided into the active area 1000 and the pad area 2000. The thin film transistor, the gate line (not shown) for applying the gate signal to the thin film transistor, and the data line (not shown) for applying the data signal to the thin film transistor may be formed on the active area 1000.

The substrate 1100 may be formed of polyamide, but is not limited thereto. Furthermore, the source electrode (not shown) and a drain electrode 111b of the thin film transistor may be formed at the time when the data line is formed on the substrate 1100. The signal line 1110a extending from the pad area 2000 to the active area 1000 may be formed when forming the data line.

The signal line 1110a may be the pad 1010 exposed in the pad area 2000 and connected to an external device. However, the present disclosure is not limited thereto. The external device connected to the pad 1010 may be the data driver or the gate driver. The external device connected to the pad 1010 may be a printed circuit board (PCB) on which the data driver and the gate driver are mounted, but is not limited thereto.

A planarization film 1120 may be formed on the drain electrode 1110b. The planarization film 112 may be patterned and the anode electrode 1130 disposed on the planarization film 112 may be connected to the drain electrode 1110b disposed below the planarization film 112. The bank 1140b may be formed on the anode electrode 1130 and the organic light emitting layer 1140a may be formed on the cavity formed in the bank 1140b.

The cathode electrode 1150 may be formed on the bank 1140b on which the organic light emitting layer 1140a is formed. The bank 1140b in which the organic light emitting layer 1140a is formed in the cavity may be referred to as the light emitting layer. The cathode electrode 1150 may be the common electrode. The first inorganic film 1160 may be formed on the cathode electrode 1150.

When the first inorganic film 1160 is formed, the dam 1120a may be formed at a portion where the pad area 2000 and the active area 1000 are adjacent to each other. The dam 1120a may be formed when the planarization film 1120 is formed. Further, the dam 1120a may be a double structure.

When the first inorganic film 1160 is formed, the first inorganic film 1160 may be patterned using a mask. The first inorganic film 1160 may not cover the pad area 2000 by patterning. The first inorganic film 1160 may cover the upper portion of the dam 1120a. However, the present disclosure is not limited thereto. In addition, an area on the substrate 1100 with respect to the dam 1120a may be divided into the active area 1000 and the pad area 2000. However, the present disclosure is not limited thereto, and the pad area 2000 may be the region in which the signal line 1110a disposed on the substrate 1100 is exposed or the conductor disposed on the signal line 1110a is exposed. The conductor disposed on the signal line 1110a may be the second touch electrode 1230 described below.

The first organic film 1170 may be formed on the first inorganic film 1160. The first organic film 1170 may be disposed to be a thick layer on the organic light emitting film 1140a to protect the organic light emitting film 1140a, so that it is possible to prevent the external matter such as moisture from penetrating into the organic light emitting film 1140a.

The first inorganic film 1160 may have a certain limit to increase the thickness. Therefore, the organic light emitting film 1140a can be protected by increasing the thickness by disposing the first organic film 1170 on the first inorganic film 1160. It is possible to prevent the first organic film 1170 from penetrating into the pad area 2000 by the dam 1120a.

The second inorganic film 1180 may be formed on the first organic film 1170. The second inorganic film 1180 may cover the upper portion of the dam 1120a formed by the first inorganic film 1160 and the planarization film 1120. The stacked first inorganic film 1160, the first organic film 1170 and the second inorganic film 1180 can be referred to as the encapsulation or the encapsulation layer.

A touch buffer layer 1190 may be formed on the second inorganic film 1180. The touch sensor may be mounted on the encapsulation or the encapsulation layer by patterning the touch electrode on the encapsulation or the encapsulation layer. Damage to the encapsulation or the encapsulation layer may occur in the process of forming the touch electrode on the encapsulation or the encapsulation layer. To solve this problem, the touch buffer layer 1190 may be formed on the encapsulation or the encapsulation layer.

The touch buffer layer 1190 may be formed of an inorganic film. The function of the touch buffer layer 1190 is not limited to preventing the encapsulation from being damaged in the process of forming the touch electrode.

The first touch electrode 1210 and the second touch electrode 1230 may be formed on the touch buffer layer 1190.

The first touch electrode 1210 may be the bridge 302 shown in FIGS. 3A to 3C and the second touch electrode 1230 may be the plurality of touch electrodes shown in FIGS. 3A to 3C.

The touch insulation film 1220 may be disposed under the touch electrode 1230. The contact hole may be formed in the touch insulation film 1220. The second touch electrode 1230 may be connected to the first touch electrode 1210 through the contact hole. The passivation layer 1240 may be formed on the second touch electrode 1230. The passivation layer 124 may be an organic film or an inorganic film.

The touch buffer layer 1190 and the second inorganic film 1180 may be formed by being patterned when the first touch electrode 1210 is formed. The signal line may be exposed by removing the second inorganic film 1180 and the touch buffer layer 1190 from the pad area 2000 by using the patterning process. The portion where the signal line is exposed may be referred to as the pad 1010. Accordingly, the area of the active area on the substrate 1100 can be widened and the area of the pad area can be reduced, thereby it is possible to implement the small bezel area structure.

After the first touch electrode 1210 is patterned, the touch insulation film 1220 is deposited. And then the second touch electrode 123 may be patterned and formed on the touch insulation film 122. At this time, the second touch electrode 123 may be formed on the signal line 111a exposed in the pad area 2000. In addition, the signal line 1110a can be in contact with the second touch electrode 1230. Accordingly, the signal can be transmitted to the second touch electrode 1230 through the signal line 1110a.

The above description and the accompanying drawings provide an example of the technical idea of the present disclosure for illustrative purposes only. Those having ordinary knowledge in the technical field, to which the present disclosure pertains, will appreciate that various modifications and changes in form, such as combination, separation, substitution, and change of a configuration, are possible without departing from the essential features of the present disclosure. Therefore, the aspects disclosed in the present disclosure are intended to illustrate the scope of the technical idea of the present disclosure, and the scope of the present disclosure is not limited by the aspect. The scope of the present disclosure shall be construed on the basis of the accompanying claims in such a manner that all of the technical ideas included within the scope equivalent to the claims belong to the present disclosure.

What is claimed is:

1. A display device comprising:
a display panel;
a touch sensor disposed on the display panel;
a first conductive layer disposed on the touch sensor unit; and
a touch controller determines a center node and a peripheral node corresponding to a touch point where a touch is generated on the display panel in response to a capacitance change in the touch sensor and determines the touch point corresponding to capacitances of the center node and the peripheral node,
wherein the first conductive layer lowers the capacitance of the center node and increases the capacitance of the peripheral node.

2. The display device of claim 1, wherein the touch sensor includes a plurality of touch driving electrodes and a plurality of touch sensing electrodes, and
wherein the plurality of touch driving electrodes are arranged to extend in a first direction, and the plurality of touch sensing electrodes are arranged in a second direction intersecting with the first direction.

3. The display device of claim 2, wherein the touch sensor further includes a plurality of bridges connecting the plurality of touch driving electrodes or the plurality of touch sensing electrodes with each other, and
wherein the plurality of touch driving electrodes are disposed on a same layer as the plurality of touch sensing electrodes, and the plurality of bridges are disposed on a layer different from the plurality of touch sensing electrodes.

4. The display device of claim 1, wherein the display panel includes a light emitting layer and an encapsulation layer sealing the light emitting layer, and
wherein the touch sensor is disposed on the encapsulation layer.

5. The display device of claim 4, further comprising a passivation layer disposed on the touch sensor and a cover glass disposed on the passivation layer.

6. The display device of claim 1, further comprising an insulation film disposed on the first conductive layer and a second conductive layer disposed on the insulation film.

7. The display device of claim 1, wherein the display panel is foldable.

8. A display device comprising:
a display panel;
a touch sensor sensing a capacitance of a plurality of nodes corresponding to a plurality of touch points on the display panel, wherein plurality of nodes includes a center node and a peripheral node surrounding the center node;
a touch controller sensing a touch by detecting a capacitance change of the center node and the peripheral node, wherein the capacitance change of the center node is greater than the peripheral node; and
a conductive layer disposed over the touch sensor that lowers the capacitance of the center node and increases the capacitance change of the peripheral node.

9. The display device of claim 8, wherein the touch sensor includes a plurality of touch driving electrodes and a plurality of touch sensing electrodes, and
wherein the plurality of touch driving electrodes is arranged to extend in a first direction, and the plurality of touch sensing electrodes are arranged in a second direction intersecting with the first direction.

10. The display device of claim 8, wherein the display panel includes a light emitting layer and a encapsulation layer sealing the light emitting layer, and
wherein the touch sensor is disposed on the encapsulation layer.

11. The display device of claim 8, wherein the display panel is foldable.

12. A display device comprising:
a light emitting layer;
an encapsulation layer sealing the light emitting layer,
a touch electrode layer disposed on the encapsulation layer sensing a capacitance of a plurality of nodes corresponding to a plurality of touch points on the display panel, wherein plurality of nodes includes a center node and a peripheral node surrounding the center node;
a passivation layer disposed on the touch electrode layer;
a cover glass disposed on the passivation layer;
a touch controller sensing a touch by detecting a capacitance change of the center node and the peripheral node, wherein the capacitance change of the center node is greater than the peripheral node; and
a first conductive layer disposed between the passivation layer and the cover glass,
wherein the first conductive layer lowers the capacitance of the center node and increases the capacitance of the peripheral node.

13. The display device of claim 12, wherein touch electrode layer includes a plurality of touch driving electrodes and a plurality of touch sensing electrodes.

14. The display device of claim 13, further comprising a plurality of bridges connecting the plurality of touch driving electrodes or the plurality of touch sensing electrodes with each other.

15. The display device of claim 14, wherein the first conductive layer and the second conductive is in a floating state with each other.

16. The display device of claim 13, wherein the plurality of touch driving electrodes are disposed on a same layer as the plurality of touch sensing electrodes, and the plurality of bridges are disposed on a layer different from the plurality of touch sensing electrodes.

17. The display device of claim 12, further comprising a second conductive layer disposed between the first conductive layer and the cover glass.

18. The display device of claim 12, wherein the first conductive layer includes a plurality of pieces, each piece having a same size as a single pixel of the display device.

19. The display device of claim 18, wherein the plurality of pieces includes a form of beads.

* * * * *